United States Patent [19]

Dunn et al.

[11] Patent Number: 5,502,563

[45] Date of Patent: Mar. 26, 1996

[54] TRANSPORTER FOR OPTICAL SPECTRUM ANALYZER IN ALIGNMENT SYSTEM

[75] Inventors: Thomas J. Dunn, Mohegan Lake; Kanti Jain, Briarcliff Manor, both of N.Y.

[73] Assignee: Anvik Corporation, Elmsford, N.Y.

[21] Appl. No.: 327,259

[22] Filed: Oct. 21, 1994

[51] Int. Cl.$^6$ ................................................. G01B 9/02
[52] U.S. Cl. ................................. 356/352; 356/346
[58] Field of Search ........................... 356/352, 355, 356/363, 356

[56] References Cited

U.S. PATENT DOCUMENTS 4,991,962  2/1991  Jain ................................. 356/349

*Primary Examiner*—Samuel A. Turner
*Assistant Examiner*—Amanda Merlino
*Attorney, Agent, or Firm*—Carl C. Kling

[57] ABSTRACT

A Fabry-Perot resonator, also called a Fabry-Perot cavity, is a spectroscopic device of extremely high resolving power and is a very useful tool for alignment of mask and wafer for the multiple exposures necessary to make a semiconductor integrated circuit. When a Fabry-Perot cavity is used for alignment in a multi-exposure imaging procedure, the cavity itself must be very accurately aligned for each exposure. For proper alignment system operation, it is necessary that one of the mirrors of the resonant cavity be fixed with respect to the mask, and the other mirror be fixed with respect to the wafer. This invention provides a mechanical system and method to maintain the alignment of a Fabry-Perot cavity for each exposure. This invention describes a technique in which the Fabry-Perot cavity is transported from one exposure area to the next without need for realignment. After an exposure is completed, the mechanical link between one of the mirrors and the mask is designed to be decoupled while the mask and wafer are relatively displaced for the next exposure. As a result, during the displacement, the relative distance between the optical mirrors of the Fabry-Perot cavity is maintained, as well as the relative orientation. After the displacement is completed, the mechanical link is then re-established so that the alignment system performs in an identical manner for each exposure site.

11 Claims, 3 Drawing Sheets

Fig. 1  Prior Art
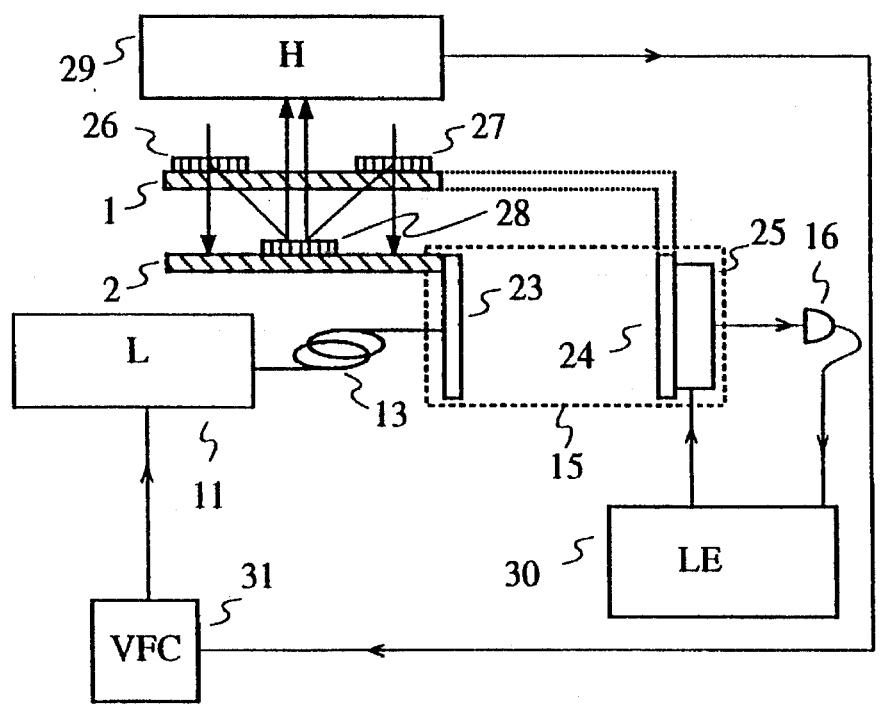
Fig. 2  Prior Art
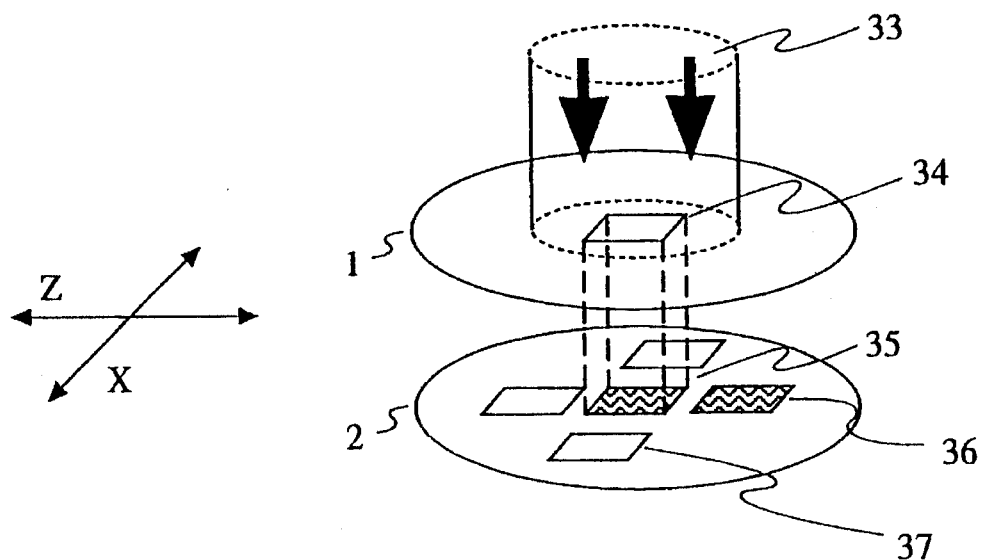

Step 1 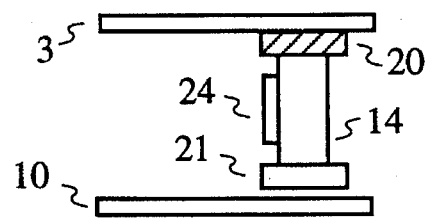
Step 2 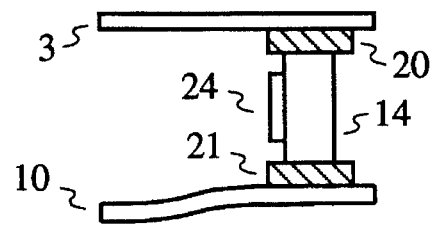
Step 3 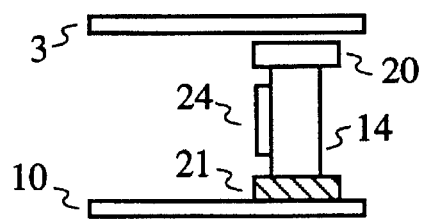
Step 4 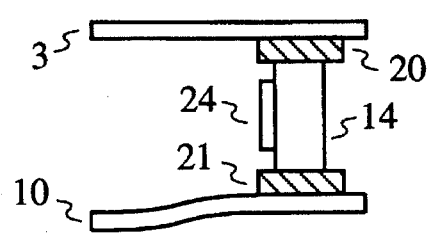
Step 5 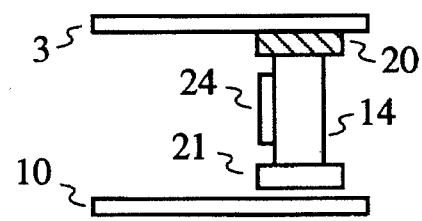
Fig. 4

TRANSPORTER FOR OPTICAL SPECTRUM ANALYZER IN ALIGNMENT SYSTEM

BACKGROUND OF THE INVENTION

1. Field of the Invention

This invention describes a transporter for an ultra-fine alignment tool which measures changes in position by referencing an optical cavity to a frequency-stabilized light source. This invention particularly relates to a mounting system equipped with a dual-locking clamp which maintains the cavity alignment when the alignment tool is relocated to a different position and minimizes the need for realignment after each change.

2. Description of Related Art

A fine alignment system incorporating a frequency-modulation spectroscopic positioning system and a dual-frequency optical heterodyne detection technique has been described by K. Jain, one of the inventors of the present application, in U.S. Pat. No. 4,991,962, issued Feb. 12, 1991. That patent uses diffraction of targets and collection of the diffracted light patterns to achieve ultra-high precision placement of a mask with respect to a substrate for microlithography. That patent shows use of a Fabry-Perot resonator as a real-time positioning system.

In the majority of step-and-repeat microlithographic imaging systems, the pattern on the mask is imaged onto the wafer for many different relative positions of the mask and wafer. This enables the exposure of the large number of chips or groups of chips (~10–100) on the wafer using a mask size equal to the size of one imaged segment. After proper alignment and exposure of each segment, the mask and wafer are displaced relative to one another by the extent of one segment. The mask and wafer are aligned again and another exposure is then made so that a duplicate image is formed on the wafer at a location adjacent to the previous exposure. This process is repeated so that a grid of identical images is formed on the wafer.

Any change to the relative position of the mask and target substrate along either the x-axis or the z-axis (the exposure beam is along the y-axis) affects the cavity mirror spacing. The mirrors will either no longer form an optical cavity, or the new optical cavity will have a significantly different free spectral range, thereby disabling the alignment system. For movement along the axis in the plane of the mirror, this problem can be resolved by making one of the mirrors wide enough so as to maintain an optical cavity in each of the relative mask-wafer positions. This is a common technique used in laser interferometry. However, when either the mask or the wafer is displaced along a direction orthogonal to the plane of the Fabry-Perot mirror, the free spectral range of the Fabry-Perot cavity will change significantly, and the fine alignment system will cease to function properly. For the exposure of each segment, the optical cavity needs to be maintained at a fixed distance and orientation.

SUMMARY OF THE INVENTION

A Fabry-Perot resonator, also called a Fabry-Perot cavity, is a spectroscopic device of extremely high resolving power. The Fabry-Perot cavity thus is a very useful tool for alignment of masks for the multiple exposures necessary to make a semiconductor integrated circuit. When a Fabry-Perot cavity is used for alignment in a multi-exposure imaging procedure, the cavity itself must be very accurately aligned for each exposure. This invention provides a 'kinematic' Fabry-Perot cavity in which the alignment of a Fabry-Perot cavity is maintained by a mechanical system and a method for each exposure. This invention describes a technique by which the Fabry-Perot cavity is transported from one exposure area to the next without need for realignment. After an exposure is completed, the mechanical link between one of the mirrors and the mask is designed to be decoupled while the mask and wafer are displaced relatively for the next exposure. As a result, during the displacement, the relative distance between the optical mirrors of the Fabry-Perot cavity is maintained, as well as the relative orientation. After the displacement is completed, the mechanical link is then re-established so that the alignment system performs in an identical manner for each exposure site.

It is the object of the invention to maintain the integrity of the Fabry-Perot cavity when making large relative changes between the mask and wafer. The relative motion between the mask and wafer involves changes in two translational degrees of freedom (x,y) as well as one rotational degree of freedom (theta). A key feature of the invention is a dual-locking clamp which permits relative changes of the mask and wafer in the three degrees of freedom, x,y, theta, while maintaining the alignment of the Fabry-Perot cavity.

An advantage of the invention is that it permits multiple repositionings of the Fabry-Perot cavity without the need for realignment, thereby saving a tedious labor-intensive operation following each repositioning.

Other objects, features and advantages will become apparent to those skilled in the art, upon review of the drawings and written description of the invention.

DRAWINGS

FIG. 1 is a diagram of the fine-alignment system in a previously patented positioning system.

FIG. 2 is a composite drawing of mask and wafer.

FIG. 4 is a composite showing steps in a repositioning operation.

DESCRIPTION OF A PREFERRED EMBODIMENT

Environment of the Invention

Figure 3:
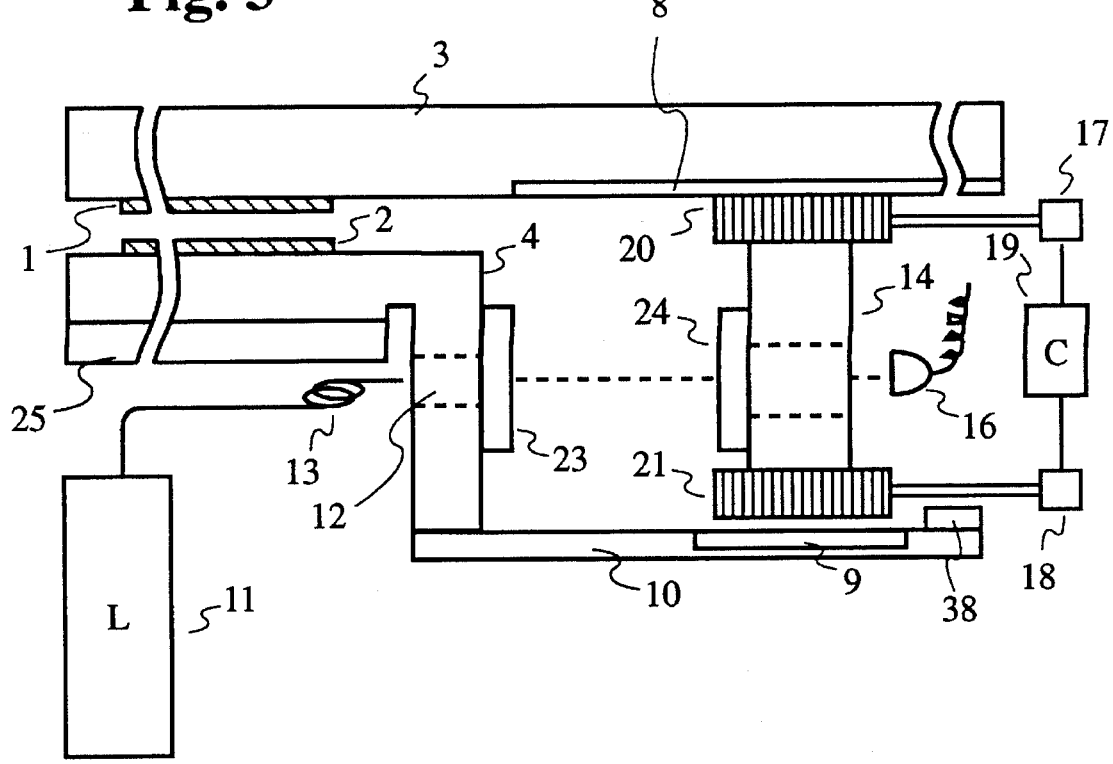
FIG. 3 is a diagram which shows the mounting system of this invention in context with a Fabry-Perot cavity as a fine-alignment system.

FIG. 1 shows the preferred environment for the invention in a versatile, high-precision, high-sensitivity alignment system incorporating a frequency-modulation spectroscopic fine positioning system and a dual frequency optical heterodyne detection technique. Applications of such fine alignment positioning systems include high-resolution X-ray and optical microlithography machines.

FIG. 1 schematically illustrates prior art which is the preferred environment for the invention, based upon the alignment system disclosed in Jain U.S. Pat. No. 4,991,962. The desired alignment between mask 1 and substrate 2 is achieved by positioning accurately a pair of mask targets, 26 and 27, with respect to a wafer target 28. The output beam from laser 11 or another laser (not shown) is directed to the two mask targets at normal incidence (ray paths from source to targets not shown). The mask targets 26 and 27, acting as transmission gratings, diffract the incident beams into various mask-grating orders. These same diffracted orders illuminate wafer target 28. The wafer target 28, acting as a reflection grating, diffracts these incident beams into various wafer-grating orders. The doubly-diffracted light recorded by the detection system 29 contain information about the relative displacement of wafer grating 28 with respect to mask gratings 26 and 27, and are further processed by control electronics to generate a signal that is used, as described later, to produce the desired displacement between the wafer and the mask to bring them into alignment.

The high-precision positioning system that uses a laser modulation spectroscopic technique to sense and produce displacements with sub-nanometer accuracy is described as follows: The stabilized laser source 11 is a source of coherent, monochromatic radiation that is referenced to an atomic transition. The output beam of frequency w from laser 11 is modulated with an input from a voltage to frequency converter (VFC) 31 at an RF frequency $w_m$, producing sidebands at frequencies $w+w_m$ and $w-w_m$. The modulated beam is directed by a fiber 13 to the Fabry-Perot cavity 15 that consists of cavity mirrors 23 and 24, and piezo-electric transducer 25. The cavity spacing is so tuned that only one of the sideband frequencies, say $w+w_m$, is transmitted through it. Further, the tuning of the cavity is kept locked to $w+w_m$ by monitoring the transmission with a detector 16, feeding the detector output to locking electronics 30, and driving piezoelectric transducer 25 with a control signal from locking electronics 30, and driving piezoelectric transducer 25 with a control signal from locking electronics 30 in such a way that the detector signal is maximized. The cavity spacing of the resonator may be stabilized at a different value by using a different modulation frequency $w_m$. Whenever $w_m$ is changed, the cavity output will deviate from its previously optimized value, causing detector 16 to instruct locking electronics 30 to drive piezoelectric transducer 25 so as to retune the cavity for maximum transmission at the new value of $w+w_m$.

Variations in the mirror spacing of the cavity are transferred into a relative displacement between the mask and wafer stages by affixing one mirror, 23, of the cavity to the wafer 2 and coupling the other mirror, 24, to mask 1. As already described above, the heterodyne signals produced by the mixing between various double-diffracted beams are processed by control electronics in heterodyne unit 29 to generate a voltage signal for correction necessary to bring the mask and wafer stages in desired alignment. The output of the heterodyne unit 29 feeds the voltage-to-frequency converter 31, which produces an RF output whose frequency $w_m'$ varies in proportion to the error voltage signal. The difference between $w_m'$ and the previous modulating frequency $w_m$ is a measure of the mask-wafer displacement. The RF output modulates the reference laser signal, leading to sidebands at frequencies $w+w_m'$ and $w-w_m'$ in the output beam. The cavity between mirrors 23 and 24, which was previously optimally tuned to frequency $w+w_m$, now has less-than-maximum transmission at the new sideband frequency $w+w_m'$. This change, detected by detector 16, causes locking electronics 30 to drive piezoelectric transducer 25 and move mirror 24 in such a way that the cavity spacing is tuned to frequency $w+w_m'$. Movements to the cavity mirror 24 are transferred to the mask 1, bringing it in desired alignment with the wafer 2.

Mask and Wafer Relationships

FIG. 2 shows in more detail how the mask is imaged onto the wafer. A unit pattern 34 appears on the mask 1. The mask 1 is illuminated by radiation 33 which enables imaging of pattern 34 onto the wafer 2. In the large majority of step-and-repeat microlithographic imaging systems, the pattern on the mask is imaged onto the wafer for many different relative positions of the mask and wafer. This enables the exposure of the large number of chips or groups of chips (~10–100) on the wafer using a mask size equal to the size of one imaged segment. After proper alignment and exposure of each segment, the mask 1 and wafer 2 are displaced relative to one another by the extent of one segment. The mask and wafer are aligned again and another exposure is then made so that a duplicate image is formed on the wafer at a location adjacent to the previous exposure. This process is repeated so that a grid of identical unit images 35–37 (images 35 and 36 shown as exposed, image position 37 not yet exposed) is formed on the wafer 2.

Description of the Invention

FIG. 3 shows in more detail the preferred embodiment of the invention. For purposes of clarity, the terms "mask" and "wafer" are used generically to include the initial object and the target object, which may take a number of forms since the usage may be selected from imaging, probing, or some other task requiring ultrafine alignment. Mask 1 and target substrate wafer 2 are to be aligned for an operation such as exposure for semiconductor integrated circuit production. It is postulated that the exposure field will be a subset of the entire target substrate field. Mask 1 is held fixed on mask base plate 3 while target substrate wafer 2 is fixed on a second base plate, to be referred to as the wafer base plate 4. The wafer base plate 4 is a reversed L-shaped support for wafer base cavity mirror 23 and a support for quasi-flexible extension 10. Extension 10 is termed "quasi-flexible" because it is a flat plate of significant breadth, incapable of flexing within its own plane, but marginally flexible vertically along its thin dimension. Extension 10 has a smooth non-porous surface 9 which provides a compatible clamping area for the wafer stage clamp 21, described below. Mask base plate 3 also has a smooth nonporous surface 8 which is similarly compatible with the mask stage clamp 20.

Cavity control laser 11 provides a collimated ray of light at a known frequency which is to serve as a length reference in the resonant cavity. A fiber optic cable 13 carries the light from the laser 11 to the Fabry-Perot cavity, formed by mirrors 23 and 24, through a hole 12 in the wafer base plate 4. The light passes through the mirror 23 into the Fabry-Perot resonant cavity, and any radiation transmitted by the cavity passes through another hole in the support 14 for cavity mirror 24. When the cavity spacing matches the frequency of the stabilized laser, a significant portion of the light resonating in the Fabry-Perot cavity will transmit through the mirror 24 and will be recorded by detector 16.

Control switch 17 operates the mask stage clamp 20 to affix the mirror support 14 onto the mask base plate 3. Control switch 18 operates the wafer stage clamp 21 to affix the mirror support 14 onto the quasi-flexible extension 10. There is a clamp control unit 19 which operates the control switches 17 and 18 to lock the mirror support 14 to either the mask base plate 3 or the quasi-flexible extension 10. The situation depicted in FIG. 1 is equivalent to having, in FIG. 3, the clamp control unit 19 such that the control switch 17 is "on" and the control switch 18 is "off" to lock the mirror support 14 to the mask base plate 3. As will be described below in detail, it is sometimes necessary to activate both control switches 17 and 18 to simultaneously lock the mirror support 14 to both extension 10 and mask base plate 3. The clamp control unit 19 may also activate only the wafer stage clamp control switch 18 so that the mirror support 14 will be supported only by the quasi-flexible extension plate 10. One of the key features of the invention is that the mirror support 14 is rigidly locked to some mechanical surface at all times during operation to maintain the alignment integrity of the cavity.

The Fabry-Perot cavity precisely measures very small changes in its mirror separation by referencing to a stabilized laser source. These changes are measured in real time during exposure of the wafer. In order for the measurements to be performed, it is necessary that one mirror 23 of the Fabry-Perot cavity be rigidly fixed with respect to the wafer 2 and the other mirror 24 be rigidly fixed with respect to the mask 1. Therefore, during exposure of the wafer, the clamp control unit 19 activates control switch 17 to keep the mirror support 14 and, hence, the end mirror 24, clamped to the mask base plate 3. When the exposure is completed, the Fabry Perot cavity and the wafer need to be repositioned so that the next exposure can be made. This transfer must not disturb the relative orientation and other parameters of the Fabry-Perot cavity. It is the function of this invention to maintain the alignment during transfer of the optical cavity to an adjacent new location on the wafer 2. Without this invention the locational transfer will cause loss of alignment due to dislocations during the transfer. Maintaining the Fabry-Perot cavity alignment is accomplished by carrying out each transfer during a period in which both the mirrors of the Fabry-Perot cavity are locked in fixed juxtaposition to each other.

After an exposure is complete, it is necessary to lock the mirrors of the Fabry-Perot in a fixed orientation while the mask and wafer are repositioned. The locking of the mirrors is accomplished by a transfer and decoupling procedure which is explained below with reference to FIG. 4. After the mask and wafer have been repositioned for the next exposure, the mirrors are unlocked by another transfer and decoupling procedure. After this complete sequence has been executed, the Fabry-Perot is again able to provide real-time alignment of the mask and wafer for a new exposure field of the wafer.

Transfer Program

FIG. 4 shows how the Fabry Perot cavity can maintain its alignment for each exposure in spite of the fact the relative mask-wafer positions change significantly from segment to segment after a transfer. During exposure, one of the mirrors of the Fabry-Perot cavity (mirror 24) is mechanically linked to the mask base plate 3 and the other mirror (mirror 23) is linked to the wafer base plate 4. When an imaging cycle has been completed, and it is desirable to transfer the mask/wafer to a new orientation while keeping the Fabry-Perot cavity within its operational envelope, the coupling/decoupling transfer program is invoked as follows;

Step 1 —Alignment

The initial real-time alignment for imaging involves a positioning of the wafer base plate 4 (FIG. 3) with respect to the mask base plate 3. During the exposure, the mirror support 14 is locked to the mask base plate 3 by activating the clamp 20. Changes in the modulation frequency in the output from laser 11 cause changes in the transmitted intensity of the sidebands recorded by detector 16. The PZT 25 (FIG. 1) tracks the changes in the sidebands by changing the cavity length in order to keep the intensity recorded by detector 16 constant. Due to the mechanical link between the mirror 23 and the wafer 2, a change in the cavity length by PZT 25 also changes the relative displacement between the mask 1 and the wafer 2, bringing them into the desired alignment. In order for this alignment algorithm to function, the one mirror (24) must be rigidly fixed to the mask 1, and the other mirror (23) must be rigidly fixed to the wafer 2.

Step 2 —Transfer

After the exposure is complete, it is necessary to move to an adjacent location for the next exposure. But first, it is necessary to transfer control of the optical cavity to the wafer stage. To make this transfer under complete control, the control unit 19 (FIG. 3) operates control switch 18 so that the clamp 21 is activated. Since the extension plate 10 is slightly flexible along one dimension, the clamp 21 pulls the plate 10 to close the small gap between them. The mirror support 14 is still rigidly fixed to the mask base plate 3, so the relative alignment between the two mirrors has not changed. Both clamps 20 and 21 are activated by the control unit 19.

Step 3 —Relocation and Preliminary Alignment

Since the mirror support is now rigidly fixed to the flexible extension plate 10, the control unit 19 (FIG. 3) operates the control switch 17 to deactivate the clamp 20. The flexible extension plate 10 will then return to its natural unflexed position and introduce a small gap between the mirror support 14 and the mask base plate 3. The two mirrors 23 and 24 of the Fabry Perot cavity are now held in a fixed relative orientation. Any change in the three degrees of freedom (x,y,theta) in the relative orientation between the mask stage and the wafer stage can be performed without affecting the cavity alignment. The mask or wafer can be moved to the next location for exposure of the next wafer segment.

Step 4 —Transfer

After all relative motions have been implemented to prepare the wafer for the next exposure segment, the mirror support 14 can now be transferred back to the mask base plate 3. As before, the transfer is made under control, with clamp 20 activated to close the gap between the mirror support 14 and the mask base plate 3. This flexes the extension plate 10 in the same manner as in the transfer step mentioned above.

Step 5 —Real-time alignment at adjacent location

Clamp 21 is now deactivated so that the mirror 24 is attached only to the mask base plate 3 and the Fabry Perot cavity is ready to perform real-time alignment at the new exposure field for the wafer 2.

Suggestions for Alternative Embodiments

The clamps 20 and 21 in the embodiment of FIG. 3 can be vacuum pucks which clamp onto the surfaces 8 and 9 by application of vacuum. This requires that the surface over which the clamps can operate be a smooth non-porous surface. The clamps can be activated and deactivated by vacuum valves 17 and 18 operated by control unit 19.

While not preferred because of weight distribution and vacuum distribution problems, it is possible to configure clamp operators 20 and 21 as having smooth surfaces, and apply the vacuum to the surface mask base plate 3 or quasi-flexible extension 10 or to appropriate sub-areas under computer control to match the location of the operators.

The clamps 20 and 21 can also be implemented by other techniques such as electro-magnetic coupling, It may be desirable to use a ferromagnetic pad and a magnetic base plate if that provides a favorable weight distribution, again with choice (if desired) of sub-area of magnetization under computer control.

This invention can include any of a variety of safety systems (38) to catch the dual-clamping mirror support (14) in the event of a failure in the system which results in an unclamped situation. This same safety system would also prevent any possible damage which may result from the mirror support colliding with an obstruction in the travel of the transporting assembly.

The invention has been described in terms of vacuum clamping of one of the mirrors of the Fabry Perot and the use of the Fabry-Perot optical cavity as the fine alignment positioning system of a mask in juxtaposition with a wafer. Alternatives of clamping techniques include the use of magnetic rather than vacuum chucks. There are many additional applications of the invention other than mask/wafer juxtaposition, involving many versions of profilometry and positioning systems. It will be clear that other changes in form and detail of fabrication and usage may be made without departure from the spirit and scope of the invention.

What is claimed is:

1. A transporter, for an alignment system for first and second objects, identified as mask (1) and wafer (2), featuring first and second cavity mirrors (23,24) forming an optical cavity referenced to a frequency stabilized light source (11), comprising:
    a) a mask base plate (3) which holds said mask (1) and has an appropriate mask stage clamping surface (8);
    b) a wafer base plate assembly (4); having means to hold said wafer (2) in an orientation which is substantially parallel to said mask (1); having means to hold said first cavity mirror (23); having an extension plate (10) with a wafer stage clamping surface (9) and having means to hold said extension plate (10) with said wafer stage clamping surface (9), substantially parallel to said mask stage clamping surface (8);
    c) a dual-clamping mirror support 914), for said second cavity mirror (24), capable of clamping to either said mask base plate (3), to said extension plate (10), or both;
    d) a mask stage clamp (20), capable of establishing a rigid connection between said mask base plate (3) and said dual-clamping mirror support (14); and
    e) a wafer stage clamp (21), capable of establishing a rigid connection between said extension plate (10) and said dual-clamping mirror support (14).

2. A transporter according to claim 1, wherein said extension plate (10) is quasi-flexible in that it is a flat plate of sufficient breadth to be incapable of flexing within its own plane, but marginally flexible vertically to its thin dimension, so that it can close the gap between itself and said wafer stage clamp (21) when said wafer stage clamp (21) is activated to close such gap.

3. A transporter according to claim 1, where said mask stage and said wafer stage clamps (20,21) are vacuum pucks, and where said mask stage clamp (20) can clamp onto said clamping surface (8) and said mask stage wafer stage clamp (21) can clamp onto said wafer stage clamping surface (9), said mask stage and said wafer stage clamping surfaces (8,9) being vacuum compatible.

4. A transporter according to claim 1, where said mask and wafer clamps (20,21) are vacuum compatible surfaces and said mask stage and wafer stage clamping surfaces (8,9) are equipped with vacuum supplies, and where said mask clamp (20) can be clamped onto the said mask stage clamping surface (8) and said wafer stage clamp (21) can be clamped onto said wafer stage clamping surface (9).

5. A transporter according to claim 1, where said dual-clamping mirror support (14) is equipped with a safety support (38) to prevent damage in any non-clamped situation.

6. A transporter according to claim 3, where said mask stage clamp (20) and said wafer stage clamp (21) are vacuum clamps selectively operated so as to apply vacuum simultaneously at an intermediate time during operational transfers.

7. A transporter according to claim 1, wherein at least one of said mask stage and said wafer stage clamps (20,21) is an electro-magnet and the corresponding ones of said clamping surfaces (8,9) are ferromagnetic.

8. A transporter according to claim 7, where said mask stage and said wafer stage clamps (20,21) can be operated to connect the mirror support (14) to either said mask base plate (3), said extension plate (10), or both.

9. A method of operating a transporter for a fine alignment system for first and second objects identified as mask (1) and wafer (2), using an optical cavity with mask stage and wafer stage clamps (20,21), a dual-clamping mirror support (14), a mask base plate (3), and a wafer base plate (4) having an extension plate (10) to maintain operational performance and the alignment integrity of the cavity by executing the following steps:
    Step 1 real time alignment, with said mask stage clamp (20) activated to hold said mirror support (14) at a fixed orientation with respect to said mask base plate (3) during the exposure of the wafer;
    Step 2 transfer with said mask stage clamp (20) activated and said wafer stage clamp (21) activated to close the gap between said mirror support (14) and said extension plate (10), thus establishing a rigid connection between said mirror support (14) and said extension plate (10);
    Step 3 relocation and preliminary alignment, with said mask stage clamp (20) de-activated and said wafer stage clamp (21) still activated to hold the two mirrors (23) and (24) of said optical cavity rigid while decoupled from the mask base plate (3) to allow said mask (1) and wafer (2) to be repositioned for the next exposure;
    Step 4 transfer, with said mask stage clamp (20) being activated while said wafer stage clamp (21) remains activated to close the gap between mirror support (14) and mask base plate (3), thus establishing a rigid connection between said mirror support (14) and said mask base plate (3); and
    Step 5 next real time alignment, with said wafer stage clamp (21) de-activated and said mask stage clamp (20) still activated to hold mirror support (14) at a fixed orientation with respect to said mask base plate (3) during the next exposure of the wafer.

10. A transporter for an alignment system comprising a frequency-stabilized reference for an optical cavity having a first cavity mirror (23) and a second cavity mirror (24) forming a resonant cavity which measures relative displacements between first object (1) and second object (2), comprising:
    a) a first base plate (3) which holds the first object (1) and has a first clamping surface (8) compatible with a first clamping device (20);
    b) a second base plate (4) which holds said second object (2) and said first cavity mirror (23) as well as an extension plate (10) which has a second clamping surface (9) substantially parallel to said first clamping surface (8), said second clamping surface (9) being compatible with a second clamping device (21);
    c) a dual-clamping cavity mirror support (14) for said second mirror (24), capable of clamping to either said first base plate (3), said extension plate (10), or both;
    d) said first clamping device (20) being capable of establishing a rigid connection between said first base plate (3) and said cavity mirror support (14);
    e) said second clamping device (21) being capable of establishing a rigid connection between said extension plate (10) and said cavity mirror support (14); and f) means to transfer position control of said mirror support (14) from said first base plate (3) to said second base plate (4), with one, the other, or both of said base plates (3,4) clamped and in contact with said mirror support (14) at all times during operation.

11. A transporter for a fine alignment system featuring first and second mirrors forming an optical cavity referenced to a frequency-stabilized light source, wherein the transporter maintains the alignment integrity and operational performance of the alignment system by a transfer algorithm and hardware comprising:

a first base plate capable of holding said second mirror;

a second base plate holding said first mirror and capable of holding said second mirror;

a dual-clamping mirror mount capable of locking to said first base plate, said second base plate, or both;

a first clamp, capable of rigidly attaching said mirror mount to said first base plate;

a second clamp, capable of rigidly attaching said mirror mount to said second base plate; and means for providing a control program in which one, the other, or both of said first and second clamps are effective;

whereby said first and second mirrors are kept within the parameters of precision during locational transfers.

* * * * *